United States Patent [19]
Argos, Jr. et al.

[11] Patent Number: 5,338,951
[45] Date of Patent: Aug. 16, 1994

[54] STRUCTURE OF HIGH DIELECTRIC CONSTANT METAL/DIELECTRIC/SEMICONDUCTOR CAPACITOR FOR USE AS THE STORAGE CAPACITOR IN MEMORY DEVICES

[75] Inventors: George Argos, Jr.; Thottam S. Kalkur, both of Colorado Springs, Colo.

[73] Assignee: Ramtron International Corporation, Colorado Springs, Colo.

[21] Appl. No.: 788,547

[22] Filed: Nov. 6, 1991

[51] Int. Cl.$^5$ .................... H01L 29/68; H01L 27/22; G11C 11/22; G11C 11/24

[52] U.S. Cl. .................... 257/295; 257/296; 365/145; 365/149

[58] Field of Search ............ 357/23.6; 365/145, 149; 257/295, 296

[56] References Cited

U.S. PATENT DOCUMENTS

| | | | |
|---|---|---|---|
| 4,536,785 | 8/1985 | Gibbons | 357/54 |
| 4,707,897 | 11/1987 | Rohrer et al. | 29/25.42 |
| 4,853,893 | 8/1989 | Eaton, Jr. et al. | 365/145 |
| 5,005,102 | 4/1991 | Larson | 361/313 |
| 5,024,964 | 6/1991 | Rohrer et al. | 437/47 |
| 5,038,184 | 8/1991 | Chiang et al. | 357/14 |
| 5,046,043 | 9/1991 | Miller et al. | 365/145 |

FOREIGN PATENT DOCUMENTS

| | | | |
|---|---|---|---|
| 0415750 | 3/1991 | European Pat. Off. | H01L 29/92 |
| 0431721A2 | 6/1991 | European Pat. Off. | H01L 21/90 |
| 0263386 | 10/1990 | Japan | 365/145 |
| 3227052 | 10/1991 | Japan . | |

OTHER PUBLICATIONS

J. K. Howard, "Capacitor Structure For Bipolar Memory Device", *IBM Technical Disclosure Bulletin*, vol. 23, No. 12, 5373–5374 (May, 1981).

G. Yi et al., "Preparation of Pb(Zr, Ti)O$_3$ thin films by sol gel processing: Electrical optical, and electro-optic properties", *J. Appl. Phys.*, 64(5): 2717–2724 (Sep. 1, 1988).

S. Wu, "Memory Retention and Switching Behavior of Metal–Ferroelectric–Semiconductor Transistors", *Ferroelectrics*, vol. 11 pp. 379–383 (1976).

K. Sugibuchi et al., "Ferroelectric Field-Effect Memory Device Using Bi$_4$Ri$_3$O Film", *Journal of Applied Physics*, vol. 46, No. 7, pp. 2877–2881 (Jul. 1975).

A. Mansingh et al., "Non-Volatile Memory Behavior of Metal–Ferroelectric (BaTiO$_3$) film—Semiconductor (Si)—MFS Devices", *IEEE*, pp. 576–579 (1986).

Kalkur et al., "Yttrium Oxide Based Metal-Insulator-Semiconductor Structures on Silicon", *Thin Solid Films*, 170 (1988).

Heyman et al., "A Ferroelectric Field Device", *Proceedings of the IEEE*, vol. 54, No. 6 (1966).

Wu, "A New Ferroelectric Memory Device, Metal–Ferroelectric–Semiconductor Transistor", *IEEE Transactions*, vol. ED-21, No. 8 (Aug., 1974).

Moazzami et al., "A Ferroelectric DRAM Cell For High-Density NVRAM's", *IEEE Electron Device Letters*, vol. 11, No. 10 (Oct., 1990).

Argos, Jr. et al., "Characteristics of Metal/PZT/p–Si MOS Capacitors", *Mat. Res. Symp. Proceedings*, vol. 200 (Nov. 16, 1990).

Parker et al., "Ferroelectric Materials For 64 Mb and 256 Mb DRAMs", *IEEE Circuits And Devices Magazine*, pp. 17–26 (Jan., 1990).

Carrano et al., "Electrical and Reliability Characteristics of Lead-Zirconate-Titanate (PZT) Ferroelectric Thin Films For DRAM Applications", *IEEE IEDM Presentation*, (Dec., 1989).

Hashimoto et al., "Leakage-Current Reduction In Thin Ta$_2$O$_5$ Films For High Density VLSI Memories", *IEEE Transactions On Electron Devices*, vol. 36, No. 1 (Jan., 1989).

Gurvitch et al., "Study of Thermally Oxidized Yttrium Films On Silicon", *Appl. Phys. Lett.*, 51(12) (Sep., 1987).

*Primary Examiner*—Sara W. Crane
*Assistant Examiner*—Valencia M. Wallace
*Attorney, Agent, or Firm*—Edward D. Manzo; Mark J. Murphy

[57] ABSTRACT

A capacitor for a semiconductor structure is formed having a substrate, a stack of a buffer layer and a layer of ferroelectric material, and a top electrode. The capacitor can also have a layer of polysilicon between the substrate and the buffer layer. A method for forming the same, through establishing a substrate, a buffer layer and a layer of ferroelectric material, defining and annealing the buffer layer and layer of ferroelectric material, and establishing a top electrode, is also disclosed.

19 Claims, 2 Drawing Sheets

STRUCTURE OF HIGH DIELECTRIC CONSTANT METAL/DIELECTRIC/SEMICONDUCTOR CAPACITOR FOR USE AS THE STORAGE CAPACITOR IN MEMORY DEVICES

BACKGROUND OF THE INVENTION

The present invention is directed to a ferroelectric capacitor having a silicon/dielectric/metal structure.

Presently, silicon dioxide is used as the dielectric in the storage capacitor of dynamic random access memory (DRAM) cells. However, as densities increase to the 64 M-bit range and beyond, charge storage using a $SiO_2$ capacitor requires a large amount of space (area) due to the low dielectric constant of $SiO_2$, which is approximately 3.9. The large area required by these capacitors results in the capacitor being too large to be of practical use in the industry. As a result, the industry has been in search of a material to replace silicon dioxide as the dielectric in a capacitor. With a larger dielectric constant, assuming the separation between capacitor plates remains the same, the same capacitance is obtained using a smaller area.

One material that has been considered for possible use as the dielectric in a capacitor is a ferroelectric material, such as a compound comprising lead zirconate titanate ("PZT"). Ferroelectric materials are of interest because materials such as PZT have a high dielectric constant. In U.S. Pat. No. 4,853,893 to Eaton, Jr. and Parris, owned by Ramtron Corporation of Colorado Springs, Colo., there is a discussion of using PZT as a dielectric material for a DRAM memory cell capacitor. That citation calls for substituting PZT for $SiO_2$. Col. 9, line 57 et seq. see also, U.S. Pat. No. 4,536,785 to Gibbons.

However, when a ferroelectric material is established on a silicon substrate, interdiffusion occurs between the ferroelectric material and the silicon substrate. As a result, a low dielectric constant layer is formed in series with the ferroelectric material causing the resulting structure (a stack) to appear as two capacitors in series, one with a low dielectric constant and one with a high dielectric constant (the ferroelectric material). This causes the effective dielectric constant of the entire stack to decrease two orders of magnitude. The two order decrease occurs because the existence of the low dielectric constant layer dominates the total capacitance of the entire stack. Accordingly, the result is a capacitor with an average capacitance rather than one with a very high capacitance as would be obtained when using a ferroelectric material without a low dielectric constant layer in series with it.

The use of a high dielectric constant stack comprising a buffer layer, a layer of ferroelectric material and a second buffer layer as the gate dielectric in a field effect transistor is the subject of an invention and companion patent application entitled Structure and Fabrication of High Transconductance MOS Field Effect Transistor Using A Buffer Layer/Ferroelectric/Buffer Layer Stack as the Gate Dielectric by the same inventors as this application, George Argos, Jr. and T. S. Kalkur (attorney docket no. RAM 342) and which is incorporated herein by reference.

The object of the present invention is to provide a capacitor and method of fabrication therefor which does not suffer from the serious drawbacks we have described.

SUMMARY OF THE INVENTION

The present invention in one of its aspects is directed to a ferroelectric capacitor for use in memory devices which require charge storage. In particular, the present invention will be useful in products which have limited area requirements, such as high density DRAMs.

The ferroelectric capacitor of the present invention overcomes the previously described problem by having a buffer layer between a substrate and a layer of ferroelectric material. The buffer layer inhibits the interdiffusion between the high dielectric constant, ferroelectric material and the silicon of the substrate. This configuration prevents the formation of a low dielectric constant material in series with the ferroelectric material. A top electrode is located over the ferroelectric material. In another embodiment, a layer of polysilicon (which preferably has been doped for conductivity) acts as a bottom electrode and is located between the substrate and the buffer layer.

The present invention is further directed to a method for forming a ferroelectric capacitor. In general, the method comprises a sequence of deposition and defining steps to form a semiconductor capacitor having a substrate, a buffer layer, a layer of ferroelectric material and a top electrode.

BRIEF DESCRIPTION OF THE DRAWINGS

In describing the preferred embodiment, reference is made to the accompanying drawings wherein like parts have like reference numerals, and wherein.

DETAILED DESCRIPTION OF THE PRESENTLY PREFERRED EMBODIMENTS

The method of the present invention comprises a series of fabrication steps which are carried out in the manner set forth below, with the reference to a preferred embodiment of using the method.

Figure 1:
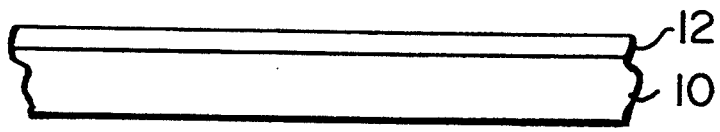
FIG. 1 is a cross-sectional view of a portion of a capacitor according to an embodiment of the present invention wherein a buffer layer is located over a substrate.

In FIG. 1, in accordance with a first embodiment of the present invention, a substrate 10 preferably comprises silicon. The substrate can be comprised of, for example, polysilicon, undoped crystal silicon, or doped (acceptor or donor) single crystal silicon. As an optional feature, the substrate can be doped so that the surface of the substrate has a higher level of dopants than the bulk of the substrate. Substrate 10 acts as the bottom electrode for the capacitor of the present invention. As a result, an additional layer for a bottom electrode is not needed. This is beneficial in ultra high density devices where conservation of space is at a premium.

Next, a buffer layer 12 is established over substrate 10, as shown in FIG. 1. Buffer layer 12 can be established by, for example, E-Beam evaporation. Layer 12 can also be established by sputtering, chemical vapor deposition, or Sol-Gel technique, for example. Buffer layer 12 preferably is comprised of a film having a relatively high dielectric constant. If the dielectric constant of the buffer layer is too low, the buffer layer will act as a second capacitor in series with the layer of ferroelectric material, infra, and cause the effective dielectric constant of the capacitor to be significantly decreased.

Buffer layer 12 should also be fabricated so that there is no interdiffusion, which results in the formation of a low dielectric constant layer, between buffer layer 12 and substrate 10 and/or the overlying layer of ferroelectric material. Accordingly, buffer layer 12 is preferably comprised of a material which has a high melting point (well above 550° C.), low porosity, and high resistivity. A material with a high density is also preferred. In addition, buffer layer 12 should be compatible with standard IC fabrication techniques $ZrO_2$, $LaO_2$, and $TiO_2$ are examples of materials which meet these requirements for buffer layer 12. Preferably, buffer layer 12 is comprised of $ZrO_2$. Layer 12 has a thickness of approximately 300 Å (30 nm).

A layer of ferroelectric material 14 is then established on top of buffer layer 12. Layer 14 can be established by, for example, deposition. The deposition can be by sputtering from a composite oxide target, chemical vapor deposition, or Sol Gel technique, for example. The ferroelectric material in layer 14 preferably comprises a lead zirconate titanate composition, called "PZT", and having the general formula Pb($Zr_xTi_{1-x}$)$O_3$. The Pb($Zr_xTi_{1-x}$)$O_3$ stoichiometry can be in the range from X=0 to X=1.0. Layer 14 has a typical thickness of 3000 Å (300 nm). Of course, the thinner the dielectric layer, the greater the capacitance of the resulting capacitor, since capacitance is inversely proportional to the separation distance between the capacitor plates.

Figure 2:
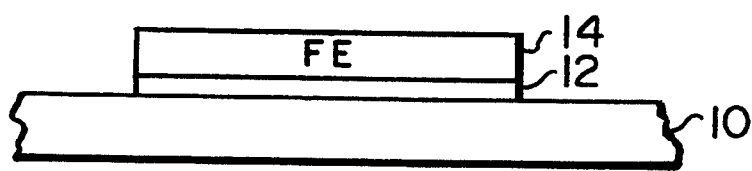
FIG. 2 shows the structure of FIG. 1 with a layer of ferroelectric material over the buffer layer; both the buffer layer and the layer of ferroelectric material having been patterned and etched.

Layer 14 and buffer layer 12 are then patterned using standard photolithographic techniques and etched to form a stack having lateral edges which are co-linear. The etching can be done either in a wet HF solution, an ion mill, a plasma etch, or another anisotropic etch. The (stack) structure shown in FIG. 2 results.

The stack (of ferroelectric material 14 and buffer layer 12) is then annealed. Preferably, the stack is annealed at a temperature above 500° C. in an $O_2$ ambient in order to convert the PZT into a high dielectric perovskite phase. Annealing can be done by either a rapid thermal anneal or furnace anneals.

A relatively conductive top electrode 16 is then established over layer 14. Top electrode 16 can be established by deposition, for example. The thickness of top electrode 16 is typically in the range between 1000 Å (100 nm) to 3000 Å (300 nm). Preferably, top electrode 16 is comprised of a noble metal. The noble metal can be, for example, platinum or palladium. In addition, the noble metal in top electrode 16 could be an alloy comprised of one of the following: platinum and palladium; platinum and titanium; platinum and bismuth; platinum and rhenium; platinum, palladium and titanium; platinum, bismuth and titanium; palladium and titanium; palladium and bismuth; palladium and rhenium; and palladium, bismuth and titanium. In another embodiment, top electrode 16 can be comprised of a doped polysilicon.

Figure 3:
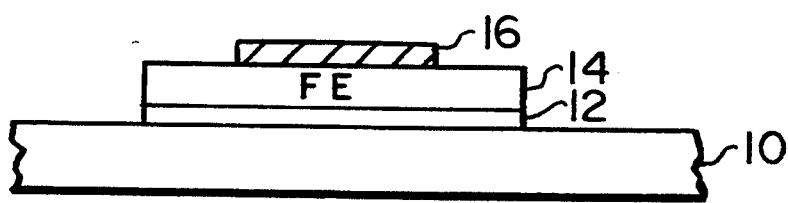
FIG. 3 shows the structure of FIG. 2 with a defined top electrode over the layer of ferroelectric material.

Top electrode 16 is then patterned using standard photolithographic techniques and etched by ion milling or plasma etching. FIG. 3 shows the resulting structure. The resulting capacitor has a dielectric constant at least 40 times that of a capacitor with a $SiO_2$ dielectric.

Figure 4:
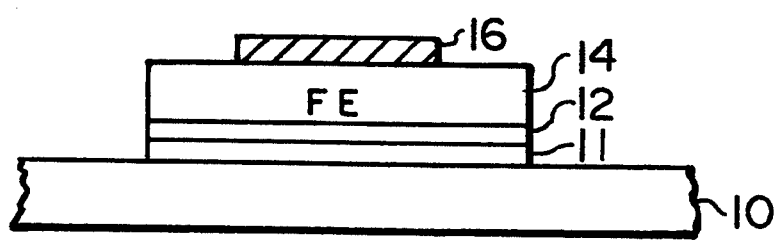
FIG. 4 is a cross-sectional view of a capacitor according to another embodiment of the present invention wherein a layer of polysilicon is located between the substrate and the buffer layer.

In a second embodiment shown in FIG. 4, a layer 11 of polysilicon is established over substrate 10. In this embodiment, layer 11 acts as the bottom electrode and individual access to the bottom electrode of the capacitor is possible. Typically, layer 11 has a thickness of 3000 Å (300 nm). Layers 12 and 14 are comprised of materials and established in a manner similar to the first embodiment. The stack comprising layers 11, 12 and 14 is then patterned, etched and annealed in a similar manner as in the first embodiment. Top electrode 15 is then established and patterned in a manner similar to that used in the first embodiment. Top electrode 16 is comprised of a noble metal.

Figure 5:
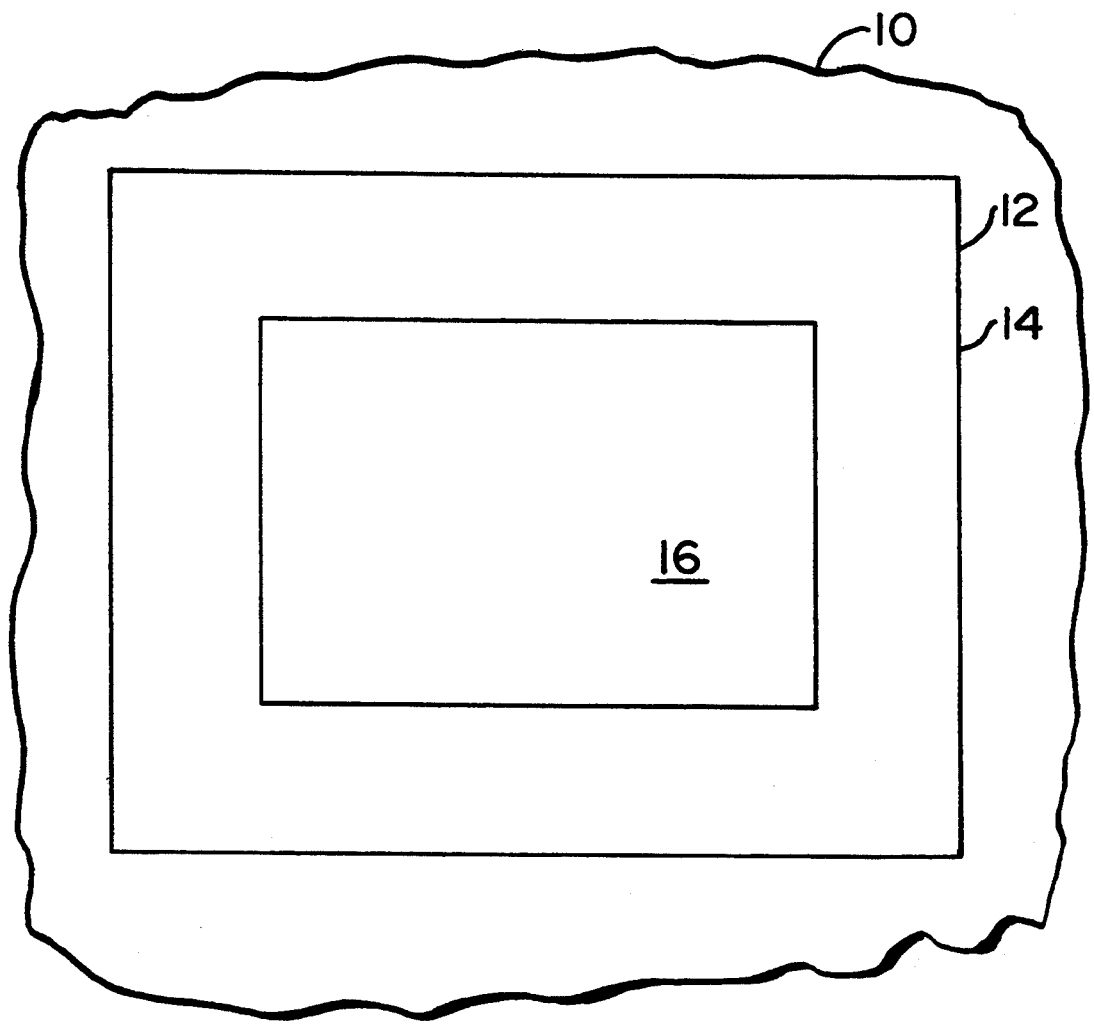
FIG. 5 is a plan view of a capacitor constructed according to the preferred embodiment.

FIG. 5 shows a plan view of an embodiment of the structure of the present invention.

The capacitor of the present invention can be used in an array of capacitors or DRAMs. For example, the capacitors could be in an array having a common bottom electrode (i.e. the silicon substrate). The capacitor of the present invention can be utilized in an array by, for example, simply interconnecting the capacitors by extending the top electrode from one capacitor to the next. If individual access to the bottom electrode of each capacitor in the array is desired, the structure of the second embodiment of the present invention, wherein a layer of polysilicon 11 acts as the bottom electrode, can be used.

The structure of the present invention can also be used in a variety of devices requiring charge storage such as SRAM and ASIC designs.

This description has been offered for illustrative purposes only and is not intended to limit the invention of this application, which is defined in the claims below.

We claim:

1. A semiconductor capacitor structure comprising:
   a substrate;
   a buffer layer located directly over and in contact with said substrate, wherein said buffer layer is comprised of a compound selected from the group comprised of zirconium oxide, lanthanum oxide and titanium oxide;
   a layer of ferroelectric material located directly over and in contact with said buffer layer; and
   a top electrode located over said ferroelectric material.

2. The capacitor of claim 1 wherein said ferroelectric material is Pb($Zr_xTi_{1-x}$)$O_3$ wherein x is in the range of 0 to 1.0.

3. The capacitor of claim 1 wherein said buffer layer is comprised of a material having a high dielectric constant.

4. The capacitor of claim 1 wherein said top electrode is a noble metal.

5. The capacitor of claim 4 wherein said noble metal is an element selected from the group comprising platinum and palladium.

6. The capacitor of claim 4 wherein said noble metal is an alloy selected from group comprising platinum, palladium, titanium, bismuth, and rhenium.

7. The capacitor of claim 1 wherein said top electrode is comprised of polysilicon.

8. The capacitor of claim 1 wherein said substrate is comprised of substantially undoped single crystal silicon.

9. The capacitor of claim 1 wherein said substrate is comprised of a doped (acceptor or donor) single crystal silicon layer.

10. The capacitor of claim 1 wherein said substrate is comprised of a polysilicon layer on a silicon substrate.

11. The capacitor of claim 1 wherein said buffer layer has a thickness of substantially 300 Å.

12. The capacitor of claim 1 wherein said layer of ferroelectric material has a thickness of substantially 3000 Å.

13. A semiconductor capacitor structure comprising:
a substrate;
a layer of polysilicon located directly over and in contact with said substrate;
a buffer layer located directly over and in contact with said layer of polysilicon;
a layer of ferroelectric material located directly over and in contact with said buffer layer; and
a top electrode located over said layer of ferroelectric material.

14. The capacitor of claim 1 wherein said semiconductor capacitor structure has no bottom electrode.

15. The capacitor of claim 1 wherein said substrate serves as a bottom electrode.

16. The capacitor of claim 13 wherein said semiconductor capacitor structure has no bottom electrode.

17. The capacitor of claim 13 wherein said substrate serves as a bottom electrode.

18. A semiconductor capacitor structure consisting essentially of:
a substrate;
a buffer layer located directly over and in contact with said substrate, wherein said buffer layer comprises a compound selected from the group comprised of zirconium oxide, lanthanum oxide and titanium oxide;
a layer of ferroelectric material located directly over and in contact with said buffer layer, the ferroelectric material being $Pb(Zr_xTi_{1-x})O_3$ where x is in the range of 0 to 1.0; and
a top electrode located over said ferroelectric material.

19. A semiconductor capacitor structure consisting essentially of:
a substrate;
a buffer layer located directly over and in contact with said substrate;
a layer of polysilicon located between said substrate and said buffer layer;
a layer of ferroelectric material located directly over and in contact with said buffer layer; and
a top electrode located over said ferroelectric material.

* * * * *